United States Patent
Chiang et al.

(10) Patent No.: US 11,545,611 B2
(45) Date of Patent: Jan. 3, 2023

(54) PIEZOELECTRIC HAIR-LIKE SENSOR, METHOD FOR MAKING SAME, AND ELECTRONIC DEVICE USING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Ming-Ta Chiang, Zhunan (TW); Min-Yu Kan, Zhunan (TW); Meng-Zhu Ma, Shenzhen (CN); Huan Ding, Shenzhen (CN); Yu-Ju Chen, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 542 days.

(21) Appl. No.: 16/503,717

(22) Filed: Jul. 5, 2019

(65) Prior Publication Data
US 2020/0321516 A1    Oct. 8, 2020

(30) Foreign Application Priority Data
Apr. 3, 2019    (CN) .......................... 201910265611.1

(51) Int. Cl.
*H01L 41/113* (2006.01)
*H01L 41/047* (2006.01)
(Continued)

(52) U.S. Cl.
CPC ............ *H01L 41/1132* (2013.01); *G01L 1/16* (2013.01); *H01L 41/0477* (2013.01);
(Continued)

(58) Field of Classification Search
CPC ....... H01L 41/29; H01L 41/45; H01L 41/082; H01L 41/193; H01L 41/257;
(Continued)

(56) References Cited

U.S. PATENT DOCUMENTS 5,907,213 A * 5/1999 Oshima .................... B60J 10/00
                                                              310/328
6,268,682 B1 * 7/2001 Audren ................... H01L 41/12
                                                              310/368
(Continued)

*Primary Examiner* — Shawki S Ismail
*Assistant Examiner* — Monica Mata
(74) *Attorney, Agent, or Firm* — ScienBiziP, P.C.

(57) ABSTRACT

A very small piezoelectric sensor capable of being mass produced includes a core, a piezoelectric layer on a surface of the core; and a conductive layer on a surface of the piezoelectric layer away from the core. The core is flexible and threadlike, the core is a first electrode of the piezoelectric sensor, and the conductive layer is a second electrode of the piezoelectric sensor. An array of such sensors allows the "skin" of a robot for example to simulate the sensitivity of hair-covered human skin. A method for making the piezoelectric sensor and an electronic device using the piezoelectric sensor are also disclosed.

20 Claims, 6 Drawing Sheets

(51) Int. Cl.
*H01L 41/08* (2006.01)
*H01L 41/193* (2006.01)
*H01L 41/257* (2013.01)
*H01L 41/29* (2013.01)
*H01L 41/338* (2013.01)
*H01L 41/45* (2013.01)
*G01L 1/16* (2006.01)

(52) U.S. Cl.
CPC .......... *H01L 41/082* (2013.01); *H01L 41/193* (2013.01); *H01L 41/257* (2013.01); *H01L 41/29* (2013.01); *H01L 41/338* (2013.01); *H01L 41/45* (2013.01)

(58) Field of Classification Search
CPC ............... H01L 41/338; H01L 41/0477; H01L 41/1132; G01L 1/16
USPC .......................................................... 310/338
See application file for complete search history.

(56) References Cited

U.S. PATENT DOCUMENTS

| | | | |
|---|---|---|---|
| 6,426,861 B1 * | 7/2002 | Munshi | C08L 23/10 361/312 |
| 2018/0169778 A1 * | 6/2018 | Sanchez | B23D 57/0007 |
| 2019/0233919 A1 * | 8/2019 | Tomalin | B23K 35/30 |
| 2021/0115727 A1 * | 4/2021 | Krisko | E06B 3/6612 |
| 2021/0351337 A1 * | 11/2021 | Ogasahara | H01L 41/45 |

* cited by examiner

PIEZOELECTRIC HAIR-LIKE SENSOR, METHOD FOR MAKING SAME, AND ELECTRONIC DEVICE USING SAME

FIELD

The subject matter herein generally relates to a piezoelectric sensor, a method for making the piezoelectric sensor and an electronic device using the piezoelectric sensor.

BACKGROUND

A skin with sensors, even though electronic, improves the application of robots and artificial limbs. However, electronic skin is "hairless" skin and does not have the tactile functions. For example, 95% of human skin is covered with fine hair, which enables human to sense many things, while electronic skin does not. Therefore, there is a need to provide hair-like sensors. Currently, hair-like sensors include, for example, piezoelectric hair-like sensors. However, being very small, piezoelectric hair-like sensors are not mass produced.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
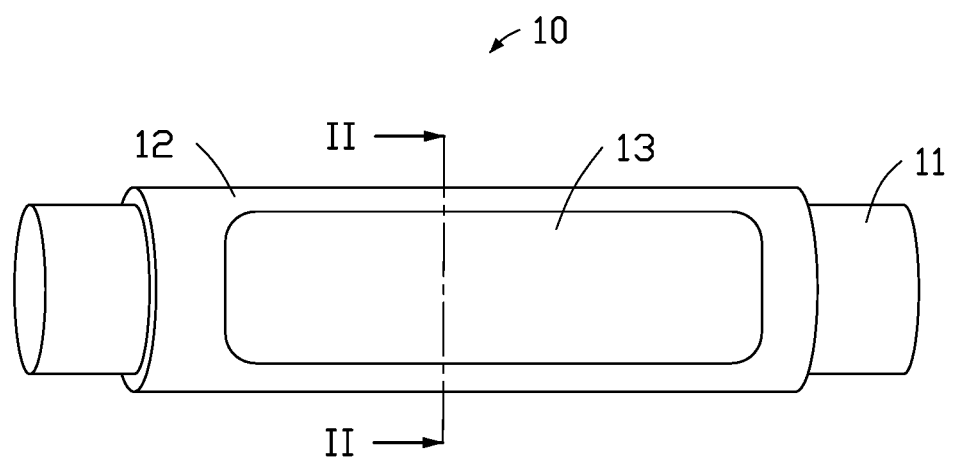
FIG. 1 is a perspective view of a piezoelectric sensor according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

Figure 2:
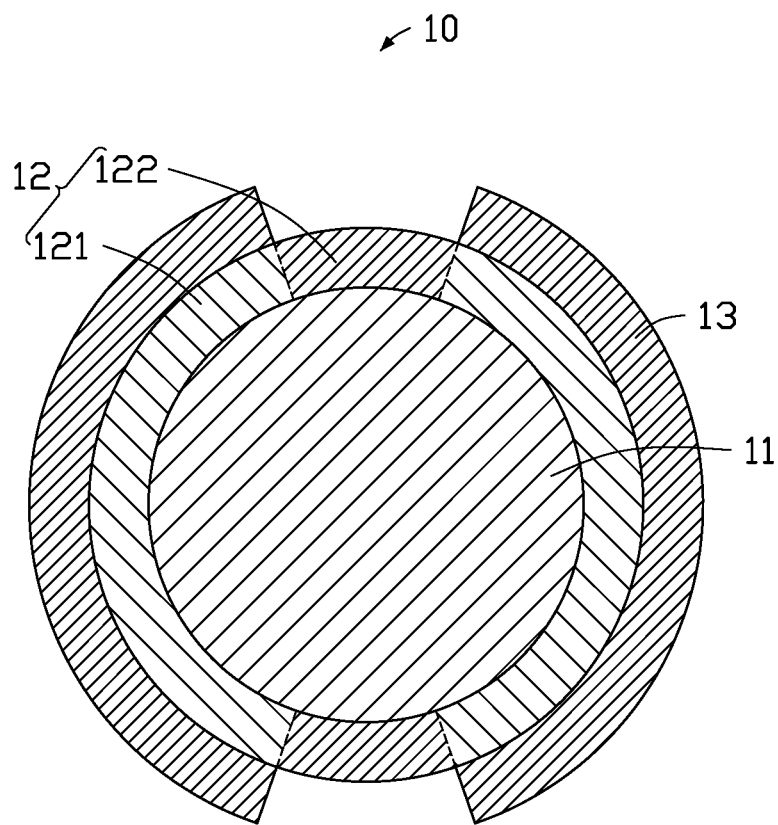
FIG. 2 is a cross-sectional view along line II-II of FIG. 1.

FIGS. 1 and 2 illustrate a piezoelectric sensor 10 including a core 11, a piezoelectric layer 12 on a surface of the core 11, and a conductive layer 13 on a surface of the piezoelectric layer 12 away from the core 11. The core 11 is threadlike and made of a flexible and deformable conductive material. The core 11 is a first electrode of the piezoelectric sensor 10, and the conductive layer 13 is a second electrode of the piezoelectric sensor 10. In one embodiment, the core 11 is substantially columnar and has a diameter of no more than 300 micrometers. A thickness of the piezoelectric layer 12 is in the range from 70 micrometers to 100 micrometers. A thickness of the conductive layer 13 is no more than 50 micrometers. In other embodiments, the core 11 may be substantially tapered with a maximum diametric dimension of no more than 600 micrometers.

The core 11 functions as a supporting structure of the piezoelectric sensor 10. The piezoelectric layer 12 in the form of a tube surrounds the core 11. The conductive layer 13 covers portions of the surface of the piezoelectric layer 12. The portions of the piezoelectric layer 12 covered by the conductive layer 13 are polarized and define polarized areas 121. Portions of the piezoelectric layer 12 not covered by the conductive layer 13 are not polarized and define non-polarized areas 122. The polarized areas are spaced apart from each other.

In one embodiment, the piezoelectric sensor 10 can be used in a similar way to human hair, to sense weak disturbances and contact such as airflows or touches. When the piezoelectric sensor 10 is disturbed by such apparent external forces, the piezoelectric layer 12 is deformed together with the core 11, so that the amount and distribution of charges in the piezoelectric layer 12 are changed. The two surfaces of the piezoelectric layer 12 adjacent to the core 11 and the conductive layer 13 thus generate a potential difference. The potential difference is sensed by the core 11 and the conductive layer 13, thereby obtaining the direction or magnitude or both of the external forces.

In one embodiment, a tensile strength Rb of the core 11 is greater than or equal to 980 Mpa. In other embodiments, the value of the tensile strength Rb of the core 11 may range from 300 MPa to 979 MPa. In one embodiment, a yield strength Rs of the core 11 is greater than or equal to 785 Mpa. In other embodiments, the value of the yield strength Rs of the core 11 may range from 200 MPa to 784 MPa. In one embodiment, an elongation of the core 11 ranges from 14 to 21.5. In one embodiment, the core 11 may be made of a flexible steel fiber, and an alloy material containing one or more of manganese (Mn), aluminum (Al), molybdenum (Mo), or titanium (Ti).

In one embodiment, the piezoelectric layer 12 may be made of polyvinylidene fluoride (PVDF), which is an organic polymer. The physical state of the PVDF changes between a solid state and a liquid state according to temperature. In other embodiments, the piezoelectric layer 12 may be made of other piezoelectric materials with deformability.

In one embodiment, the conductive layer 13 is made of a conductive material such as silver paste, an alloy containing copper and gold or one of them, or an organic substance doped with conductive particles.

Figure 3:
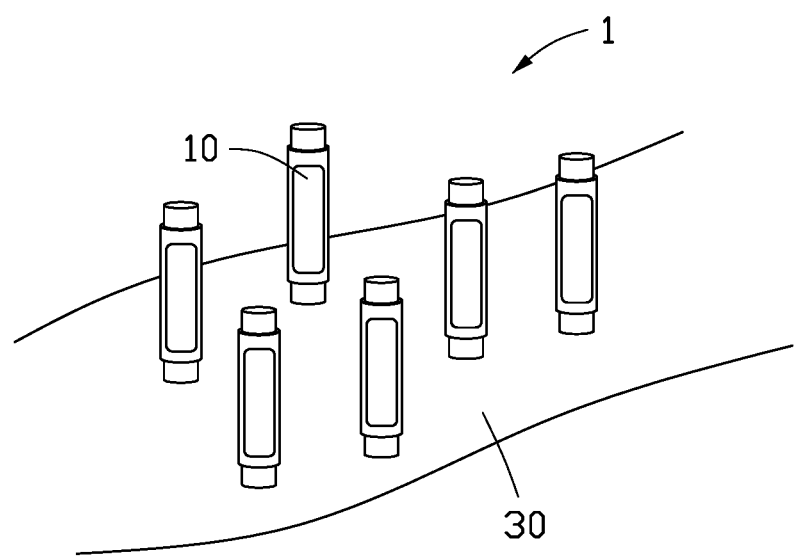
FIG. 3 is a perspective view of an electronic device using the piezoelectric sensor shown in FIG. 1.

Referring to FIG. 3, a hand or one finger of a human body is taken here as exemplary application of an electronic device 1. The skin on a hand of a human body is simulated by the device 1 including a main body 30 and a plurality of piezoelectric sensors 10 mounted on the main body 30 and electrically connected to the main body 30. The piezoelectric sensors 10 can be used as hairs on the hand or finger to sense weak disturbances and physical contacts.

Figure 4:
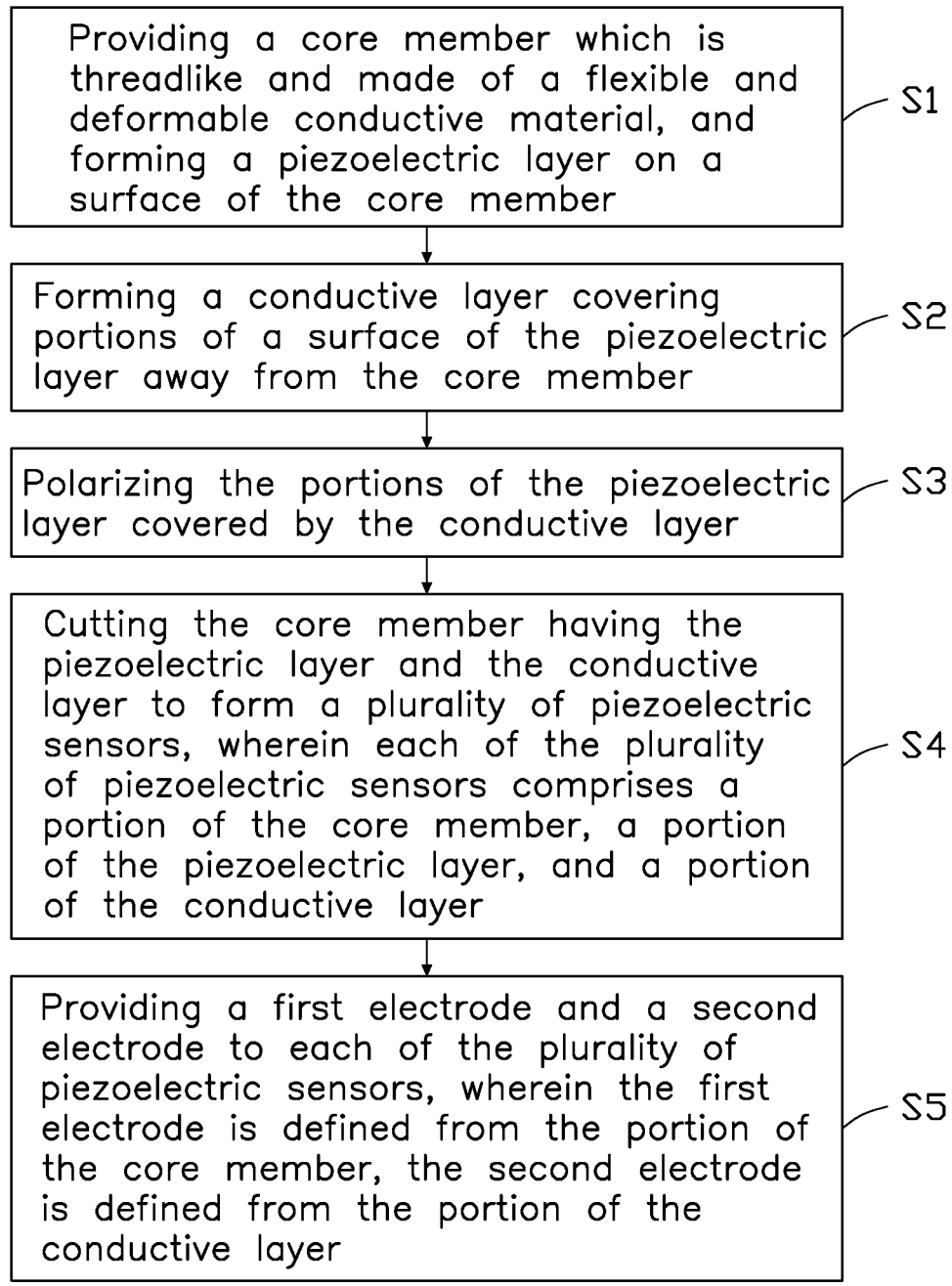
FIG. 4 is a flow chart of a method for making the piezoelectric sensor shown in FIG. 1.

Referring to FIG. 4, a flowchart of one embodiment of a method is disclosed. The method is provided by way of embodiment, as there are a variety of ways to carry out the method. The method described below can be carried out using the configurations illustrated in FIGS. 5 and 6 for example, and various elements of these figures are referenced in explaining the method. Each block shown in FIG. 4 represents one or more processes, methods, or subroutines, carried out in the method. Additionally, the illustrated order of blocks is by example only and the order of the blocks can change. The method can begin at Block S1.

Block S1: providing a core member 14 which is threadlike and made of a flexible and deformable conductive material and forming a piezoelectric layer 12 on a surface of the core member 14.

Figure 5:
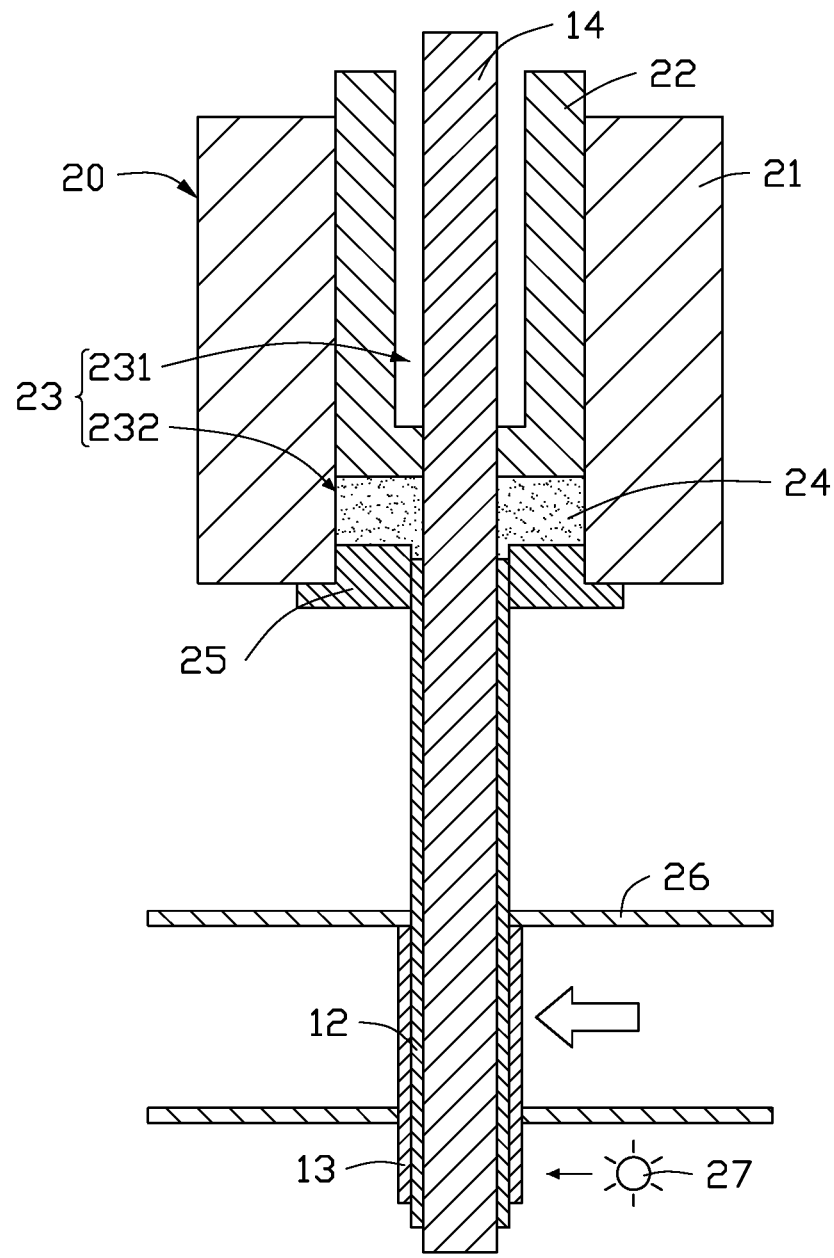
FIG. 5 is a cross-sectional view illustrating Block S2 of the method of FIG. 4.

As shown in FIG. 5, a layer-making machine 20 is provided. The machine 20 includes a chamber 21, a piston 22, and a runner 25. Inner chamber wall of the chamber 21 defines a receiving cavity 23. The piston 22 is in the chamber 21 and is movable relative to the chamber 21, thus dividing the receiving cavity 23 into a first cavity 231 and a second cavity 232. The runner 25 is adjacent to the second cavity 232 and communicates with the second cavity 232.

As shown in FIG. 5, a piezoelectric material 24 in molten state is in the second cavity 232. The core member 14 is clamped by the piston 22. A portion of the core member 14 is in the first cavity 231, and a portion of the core member 14 is immersed into the piezoelectric material 24 in the second cavity 232. Under the pushing of the piston 22, the core member 14 passes through the runner 25, and the molten piezoelectric material 24 covers a surface of the core member 14. Then, a cooling process is carried out, and the molten piezoelectric material 24 on the core member 14 passing through the flow passage 25 is cooled and solidified to obtain the piezoelectric layer 12. The molten piezoelectric material 24 may be cooled naturally, or by air cooling, or by water cooling, etc.

In one embodiment, the piezoelectric material 24 is PVDF piezoelectric material, and the molten PVDF piezoelectric material passing through the runner 25 is stretched to transform the PVDF piezoelectric material from an α phase into a β phase.

Block S2: forming a conductive layer 13 partially covering a surface of the piezoelectric layer 12 away from the core member 14.

In one embodiment, the conductive layer 13 may be made of silver paste. As shown in FIG. 5, the core member 14 with the piezoelectric layer 12 passes through a clapboard 26 under the continuous pushing of the piston 22. A silver paste layer is formed on the surface of the piezoelectric layer 12 by spraying or spin coating. Then, the silver paste layer is cured by irradiation from a light source 27, which emits ultraviolet light, to obtain the conductive layer 13.

Figure 6:
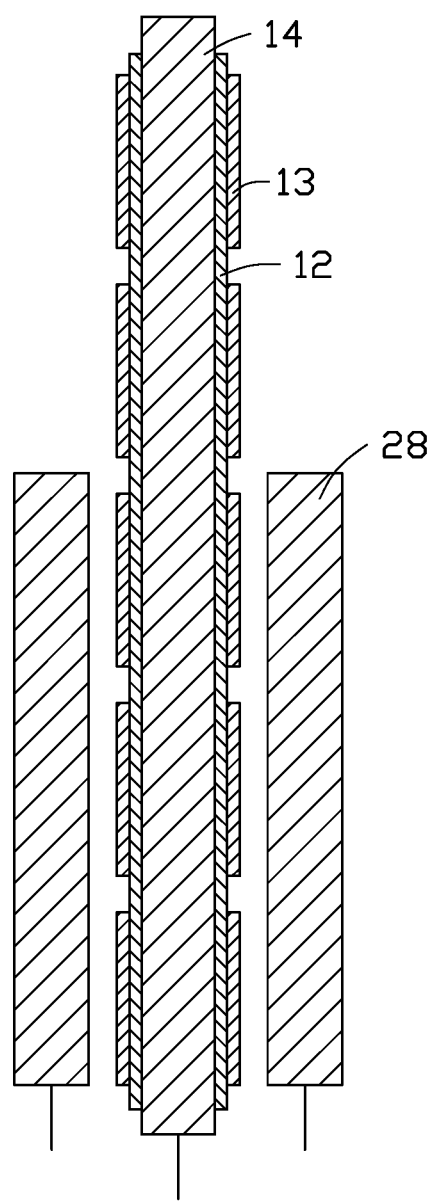
FIG. 6 is a cross-sectional view illustrating Block S3 of the method of FIG. 4.

In one embodiment, when the core member 14 with the piezoelectric layer 12 passes through the clapboard 26, a silver paste layer can be applied intermittently on the surface of the piezoelectric layer 12. Thus a series of conductive layers 13, with spaces (interruptions) between them along a length direction of the core member 14 can be formed, as shown in FIG. 6.

In other embodiments, the conductive layer 13 may be made of a simple metal substance or an alloy, and be formed by physical vapor deposition (PVD) or chemical vapor deposition (CVD).

Block S3: polarizing the piezoelectric layer 12 covered by the conductive layer 13, as follows.

The core member 14 with the piezoelectric layer 12 and the conductive layer 13 are placed between two electrode plates 28. Then, when the two electrode plates 28 are in contact with the conductive layer 13, applying a first voltage (e.g., 600 V) to the core member 14, and applying a second voltage different from the first voltage to the conductive layer 13, the two electrode plates 28 being grounded on the far side. An electric field is created by the first and second voltages between the core member 14 and the conductive layer 13 to polarize the piezoelectric layer 12 covered by the conductive layer 13. Portions of the piezoelectric layer 12 covered by the conductive layer 13 are polarized and these portions define polarized areas 121 (labeled in FIG. 2). Portions of the piezoelectric layer 12 not covered by the conductive layer 13 are not polarized and these portions define non-polarized areas 122 (labeled in FIG. 2).

In one embodiment, the polarized areas 121 are spaced apart from each other in the circumferential direction of the core member 14.

Block S4: cutting the core member 14 having the piezoelectric layer 12 and the conductive layer 13 to form a plurality of piezoelectric sensors 10, wherein each of the piezoelectric sensors 10 includes a portion of the core member 14, a portion of the piezoelectric layer 12, and a portion of the conductive layer 13.

Block S5: providing a first electrode and a second electrode to each of the piezoelectric sensors 10, wherein the first electrode is defined from the portion of the core member 14, the second electrode is defined from the portion of the conductive layer 13.

The method achieves mass production of the piezoelectric sensors 10.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A piezoelectric sensor, comprising:
   a core;
   a piezoelectric layer on a surface of the core; and
   a conductive layer on a surface of the piezoelectric layer away from the core, wherein the core is threadlike and made of a flexible and deformable conductive material, the core is a first electrode of the piezoelectric sensor, and the conductive layer is a second electrode of the piezoelectric sensor; wherein the piezoelectric layer comprises polarized areas which are polarized and non-polarized areas which are not polarized, the polarized areas are spaced apart from each other in a circumferential direction of the core, and each of the polarized areas is between and in direct contact with adjacent non-polarized areas; the conductive layer consists of parts spaced apart from each other in the circumferential direction of the core, the parts of the conductive layer are one-to-one positioned relative to the polarized areas of the piezoelectric layer, each of the parts of the conductive layer covers and is in direct contact with a corresponding one of the polarized areas, and the conductive layer does not cover the non-polarized areas of the piezoelectric layer.

2. The piezoelectric sensor according to claim 1, wherein the core is columnar or tapered.

3. The piezoelectric sensor according to claim 1, wherein the piezoelectric layer surrounds the core to form a tubular shape.

4. The piezoelectric sensor according to claim 1, wherein the core is columnar and has a diameter no more than 300 micrometers; or the core is tapered with a maximum diametric dimension no more than 600 micrometers.

5. The piezoelectric sensor according to claim 1, wherein a thickness of the piezoelectric layer is in a range from 70 micrometers to 100 micrometers.

6. The piezoelectric sensor according to claim 1, wherein a thickness of the conductive layer is no more than 50 micrometers.

7. The piezoelectric sensor according to claim 1, wherein a tensile strength of the core is greater than or equal to 980 Mpa.

8. The piezoelectric sensor according to claim 1, wherein a yield strength of the core is greater than or equal to 785 Mpa.

9. The piezoelectric sensor according to claim 1, wherein the core is made of a flexible steel fiber, and an alloy material containing one or more of manganese (Mn), aluminum (Al), molybdenum (Mo), or titanium (Ti).

10. An electronic device, comprising a main body and a plurality of piezoelectric sensors mounted on the main body and electrically connected to the main body, each of the plurality of piezoelectric sensors comprising:
a core;
a piezoelectric layer on a surface of the core; and
a conductive layer on a surface of the piezoelectric layer away from the core, wherein the core is threadlike and made of a flexible and deformable material, the core is a first electrode of the piezoelectric sensor, and the conductive layer is a second electrode of the piezoelectric sensor; wherein the piezoelectric layer comprises polarized areas which are polarized and non-polarized areas which are not polarized, the polarized areas are spaced apart from each other in a circumferential direction of the core, and each of the polarized areas is between and in direct contact with adjacent non-polarized areas; the conductive layer consists of parts spaced apart from each other in the circumferential direction of the core, the parts of the conductive layer are one-to-one positioned relative to the polarized areas of the piezoelectric layer, each of the parts of the conductive layer covers and is in direct contact with a corresponding one of the polarized areas, and the conductive layer does not cover the non-polarized areas of the piezoelectric layer.

11. The electronic device according to claim 10, wherein the core is columnar or tapered.

12. The electronic device according to claim 10, wherein the piezoelectric layer surrounds the core to form a tubular shape.

13. The electronic device according to claim 10, wherein the core is columnar and has a diameter no more than 300 micrometers; or the core is tapered with a maximum diametric dimension no more than 600 micrometers.

14. The electronic device according to claim 10, wherein a thickness of the piezoelectric layer is in a range from 70 micrometers to 100 micrometers, and a thickness of the conductive layer is no more than 50 micrometers.

15. The electronic device according to claim 10, wherein a tensile strength of the core is greater than or equal to 980 Mpa.

16. The electronic device according to claim 10, wherein a yield strength of the core is greater than or equal to 785 Mpa.

17. The electronic device according to claim 10, wherein the core is made of a flexible steel fiber, and an alloy material containing one or more of manganese (Mn), aluminum (Al), molybdenum (Mo), or titanium (Ti).

18. A method for making a piezoelectric sensor, comprising:
providing a core member which is threadlike and made of a flexible and deformable conductive material, and forming a piezoelectric layer on a surface of the core member;
forming a conductive layer covering portions of a surface of the piezoelectric layer away from the core member;
polarizing the portions of the piezoelectric layer covered by the conductive layer, wherein the portions of the piezoelectric layer covered by the conductive layer are polarized and define polarized areas, and portions of the piezoelectric layer not covered by the conductive layer are not polarized and define non-polarized areas;
cutting the core member having the piezoelectric layer and the conductive layer to form a plurality of piezoelectric sensors, wherein each of the plurality of piezoelectric sensors comprises a portion of the core member, a portion of the piezoelectric layer, and a portion of the conductive layer, the polarized areas in each of the plurality of piezoelectric sensors are spaced apart from each other in a circumferential direction of the portion of the core member, and each of the polarized areas in each of the plurality of piezoelectric sensors is between and in direct contact with adjacent non-polarized areas; and
providing a first electrode and a second electrode to each of the plurality of piezoelectric sensors, wherein the first electrode is defined from the portion of the core member, the second electrode is defined from the portion of the conductive layer, the portion of conductive layer consists of parts spaced apart from each other in the circumferential direction of the core, the parts of the portion of the conductive layer are one-to-one positioned relative to the polarized areas of the piezoelectric layer, each of the parts of the portion of the conductive layer covers and is in direct contact with a corresponding one of the polarized areas, and the conductive layer does not cover the non-polarized areas of the piezoelectric layer.

19. The method for making a piezoelectric sensor according to claim 18, wherein forming the piezoelectric layer comprising providing a molten polyvinylidene fluoride (PVDF) piezoelectric material, coating the molten PVDF piezoelectric material to a surface of the core member, curing and stretching the molten PVDF piezoelectric material to transform the molten PVDF piezoelectric from an α phase into a β phase.

20. The method for making a piezoelectric sensor according to claim 18, wherein the portions of the piezoelectric layer covered by the conductive layer are polarized by forming an electric field between the core member and the conductive layer.

* * * * *